United States Patent [19]

Asmus et al.

[11] Patent Number: 5,204,506

[45] Date of Patent: Apr. 20, 1993

[54] PLASMA PINCH SURFACE TREATING APPARATUS AND METHOD OF USING SAME

[75] Inventors: John F. Asmus, LaJolla; Ralph H. Lovberg, San Diego, both of Calif.

[73] Assignee: The Regents of the University of California, Alameda, Calif.

[21] Appl. No.: 425,865

[22] Filed: Oct. 24, 1989

Related U.S. Application Data

[63] Continuation-in-part of Ser. No. 129,152, Dec. 7, 1987, Pat. No. 4,889,605, and a continuation-in-part of Ser. No. 223,025, Jul. 21, 1988, Pat. No. 4,994,715, and a continuation-in-part of Ser. No. 347,422, May 4, 1989, Pat. No. 5,079,187, and continuation-in-part of Ser. No. 347,423, May 4, 1989, Pat. No. 5,048,163.

[51] Int. Cl.[5] .................... B23K 9/00; G01N 23/20
[52] U.S. Cl. .................... 219/121.37; 219/121.43; 378/34; 378/119; 315/111.71; 427/534
[58] Field of Search ........... 219/121.43, 121.4, 121.37, 219/121.59; 378/119–123, 34; 315/111.71, 111.21, 111.41; 156/345; 427/54.1

[56] References Cited

U.S. PATENT DOCUMENTS

| | | | |
|---|---|---|---|
| 4,450,568 | 5/1984 | Asmus | 372/76 |
| 4,771,430 | 9/1988 | Suckewer et al. | 372/5 |
| 4,837,794 | 6/1989 | Riordan et al. | 378/119 |

FOREIGN PATENT DOCUMENTS

| | | | |
|---|---|---|---|
| 0186491 | 7/1986 | European Pat. Off. | 378/119 |
| 0145257 | 9/1982 | Japan | 378/119 |
| 0267895 | 11/1990 | Japan | 378/119 |

*Primary Examiner*—Mark H. Paschall
*Attorney, Agent, or Firm*—Bernard L. Kleinke; Jerry R. Potts; William Patrick Waters

[57] ABSTRACT

The inventive system treating the surface of a material by utilizing high intensity ultraviolet light for glazing, cleaning and other such purposes. The system includes a high intensity ultraviolet light is generated by a liquid jet plasma pinch unit, and is repetitively pulsed to raise the surface temperature of the material rapidly to a predetermined high temperature. In one form of the invention, the system is mounted either on a vehicle, or on an overhead structure for facilitating the movement of the pinch unit to the surface to be treated. In another form of the invention, the pinch unit includes a light emitting assembly which can be lowered into an opening in a workpiece to be treated.

11 Claims, 4 Drawing Sheets

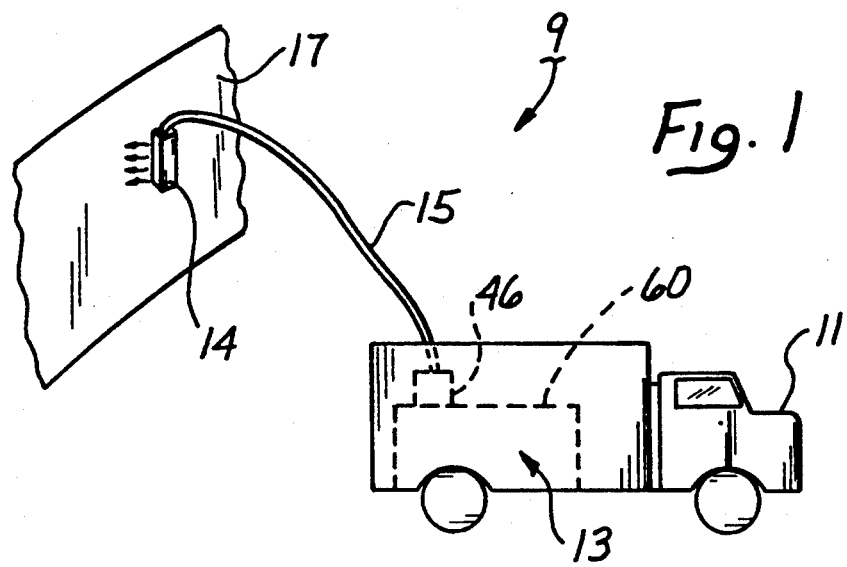
Fig. 1
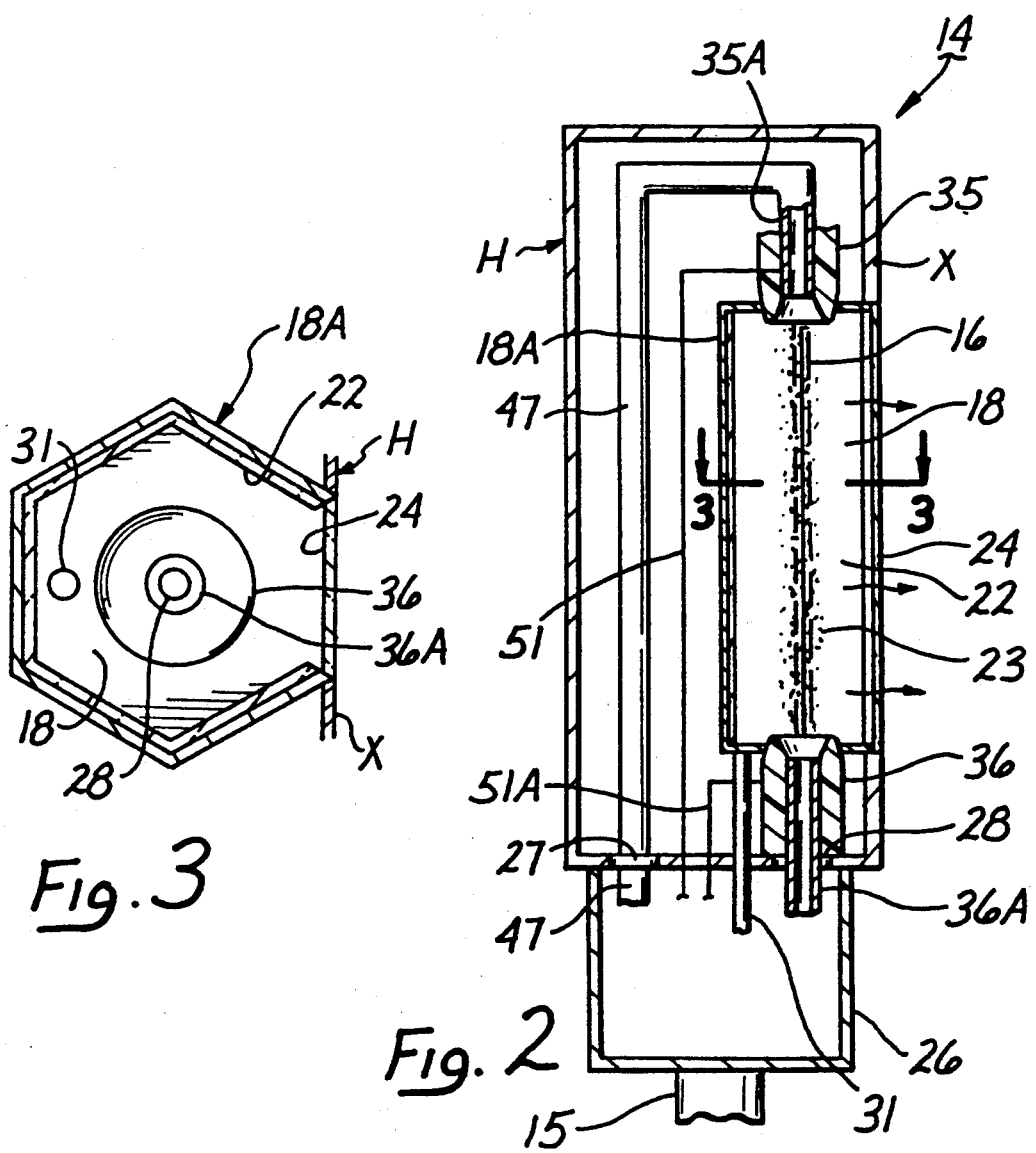
Fig. 3
Fig. 2

PLASMA PINCH SURFACE TREATING APPARATUS AND METHOD OF USING SAME

This invention was made with Government support under Contract No. N00014-85-K-0598 awarded by the Office of Naval Research. The Government has certain rights in this invention.

CROSS REFERENCE TO RELATED APPLICATION

This is a continuation-in-part patent application of copending U.S. patent applications Ser. No. 07/129,152 filed Dec. 7, 1987, now U.S. Pat. No. 4,889,605, entitled Plasma Pinch System and Method of Making Same and Ser. No. 07/223,025 filed Jul. 21, 1988, now U.S. Pat. No. 4,994,715, entitled Plasma Pinch System and Method of Making Same and Ser. No. 07/347,422, filed May 4, 1989, now U.S. Pat. No. 5,079,187, entitled "Method for Processing Semiconductor Materials," and Ser. No. 07/347,423 filed May 4, 1989, now U.S. Pat. No. 5,048,163, entitled "System for Processing Semiconductor Materials." Each one of the applications is assigned to the same assignee as the present patent application. The subject matter disclosed in said copending patent applications are incorporated herein by reference, as if fully set forth herein.

TECHNICAL FIELD

The present invention relates in general to a method of surface treating materials, and it more particularly relates to such a system and method for treating a material surface in an improved manner, by utilizing intense ultraviolet light radiation.

BACKGROUND ART

There has been a long felt need for developing a method and apparatus for processing the surface of a semiconductor material impregnated with a dopant to create a high speed semiconductor device having a very shallow depth dopant diffusion factor. The apparatus and methods disclosed in the foregoing mentioned copending applications relate to such a system for meeting this need.

It would be highly desirable to utilize the system and equipment described in these copending applications for the treatment of other types and kinds of material surfaces as well. For example, it would be highly advantageous to employ the highly intense ultraviolet light for use in cleaning surfaces of vehicles, particularly of toxic chemical warfare agents.

While prior known vehicle cleaning techniques have been successful for some applications, it has been difficult, if not impossible, to employ conventional cleaning techniques for refinishing the surface of large air and sea vehicles, such as certain aircraft, ships, or the like, without moving the vehicle to a special processing area, due to various pollutants created during the refinishing process. The pollutants include not only air borne particles and debris which are removed from the surface of the vehicle being treated, but also includes water or sand being discharged forcefully against the surface being cleaned and organic (chlorinated hydrocarbon) solvents used in stripping epoxy and polyurethane paints. Such pollution is, of course, undesirable and unwanted, and is prohibited by laws or regulations in the United States in certain situations. Thus, when a vehicle requires refinishing, it is desirable to enclose the vehicle in a special processing shed or hanger to avoid contaminating the general environment with the pollutants formed by the dislodged coating materials and substances.

Therefore, it would be highly desirable to have a new and improved system which enables a vehicle to be stripped of unwanted and undesired coating materials and substances, without using high velocity jet-streams which would otherwise produce air borne particles or other pollutants as the coating materials being removed from the surface of the vehicle. Such an improved system employing the ultraviolet light techniques disclosed in the foregoing mentioned patent applications, should not require special vehicle enclosures such as a processing hanger or shed or toxic paint stripping chemicals.

In other surface treating applications, such as in the manufacture of metallic parts, there are various steps involved in processing the surface of such parts. One such step, relates to glazing the surface of the metallic part to give it a hardened durable finish. While the prior known techniques employed to accomplish such a processing step have been acceptable for some applications, they have not been entirely satisfactory.

One attempted solution to the conventional metal glazing techniques was to use a laser to scan and to heat the surface of the material. While this technique tends to localize heating, it has proven to be less than entirely satisfactory in certain applications to provide the desired durability. Moreover, the cost of the lasers required to achieve the necessary rapid heating for glazing purposes, has proven to be a relatively expensive, and the glazing technique is unduly complex. In this regard, trained and skilled personnel are required to operate the expensive laser equipment.

Metal glazing is employed for certain intricate parts that having holes, apertures, and recesses. For example, in the manufacture of engine blocks, it is very desirable to glaze the cylinder walls of the block to improve the durability of the wear surfaces.

Thus, there are a variety of different types and kinds of surfaces requiring improved forms of treatments. Thus, it would be highly desirable to achieve such improved forms of treatment through the use of high intensity ultraviolet light.

DISCLOSURE OF INVENTION

Therefore, the principal object of the present invention is to provide a new and improved system and method of treating material surfaces by utilizing high intensity ultraviolet light surfaces.

Another object of the present invention is to provide such a new and improved system and method for glazing material surfaces.

Another object of the present invention, is to provide such a new and improved system and method of stripping material surfaces of unwanted or undesired coatings and other substances.

Briefly, the above and further objects and features of the present invention are realized by providing a new and improved highly-.intense ultraviolet light system and technique for processing material surfaces. The inventive system and method may be utilized to strip or to clean material surfaces, of unwanted and undesired coatings. The inventive system and method may also be employed, to glaze metal and the like materials in an improved manner.

The inventive system and process include exposing a material surface to the inventive incoherent ultraviolet light source, which is controlled at a very high repetition rate. For example, when used to glaze the surface of a material, a high intensity ultraviolet light is guided toward the surface of the material to be glazed. The material is then exposed to the ultraviolet light which is pulsed at a very rapid rate, for a sufficient amount of time to cause the surface of the material to be glazed.

By employing the inventive system and method, material surfaces can be readily treated in an improved manner. For example, high intensity light system pulsed at a high repetition rate, irradiates the surface of the material to strip it of all coating materials in a highly effective and efficient manner. The ultraviolet radiation produced by the light source provides a desired shallow depth of penetration, while the high peak power causes the coating material to separate from its substrate or surface, without producing unwanted and undesired airborne particles to form pollution.

Thus, the novel system and method of the present invention are utilized to treat surfaces in a vastly superior manner, and to produce finished products characterized by improved surface characteristics.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 1 is a pictorial diagrammatic view of a land vehicle mounted material treating ultraviolet light emitting system which is adapted for treating the surface of a large item of manufacture, and which is constructed in accordance with the present invention;

FIG. 2 is an enlarged sectional view of the light emitting head or device of the system of FIG. 1;

FIG. 3 is a sectional view of the device FIG. 2 taken substantially on line 3—3 thereof;

BEST MODE FOR CARRYING OUT THE INVENTION

Figure 4:
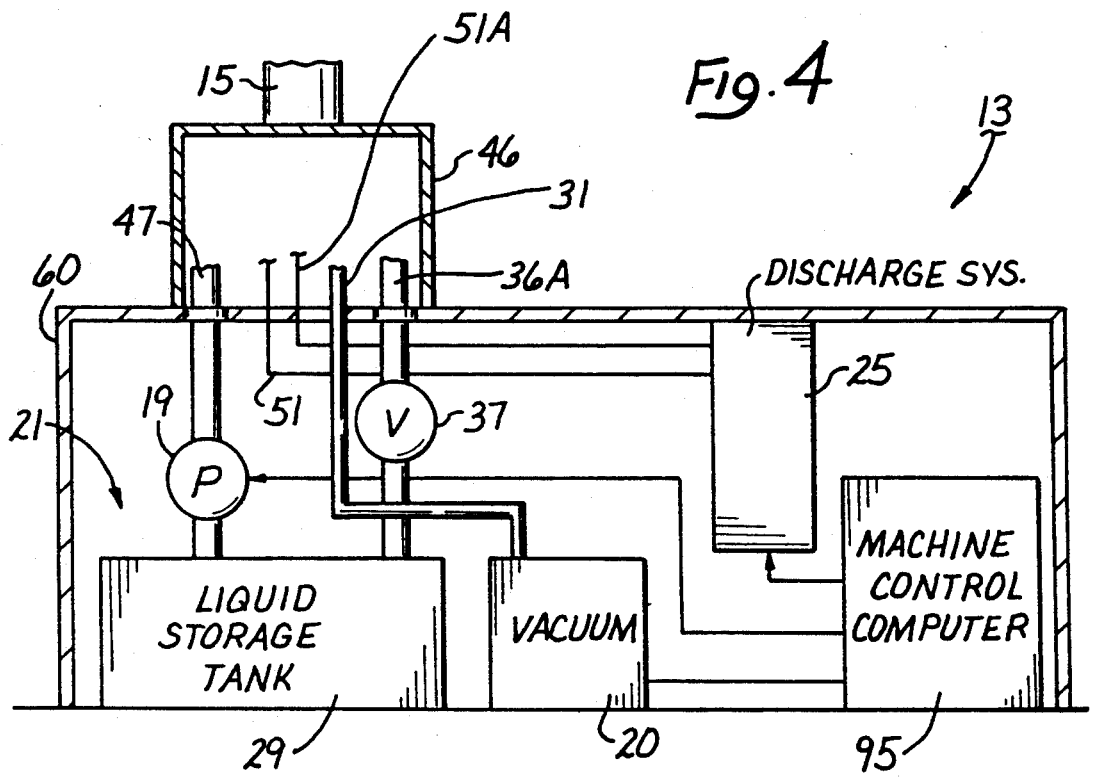
FIG. 4 is a diagrammatic sectional view of the on-board unit of the system of FIG. 1.

Referring now to FIG. 1 there is shown a liquid-jet plasma pinch surface treating system 9, which is constructed in accordance with the present invention, and which is adapted to be mounted on board of a mobile unit or vehicle 11 in the form of a vehicle such as a truck or van. In this regard, the mobile unit 11, is able to transport conveniently the liquid-jet surface treating system 9 so that it can be utilized in a variety of applications such as applications involving large, bulky surfaces to be treated. For example, the system 9 can be used to clean unwanted coating material from structures, including walls and other large surface areas. The system 9 can also be transported to an aircraft to strip its outer painted surface of its paints and the like, without polluting the air.

The liquid-jet plasma pinch surface treating system 9 generally includes an on-board plasma control assembly or unit 13 connected via a cable 15 to an ultraviolet light emitting head or assembly 14 for treating a surface 17. The liquid-jet plasma pinch system 12 establishes a source of high intensity incoherent ultraviolet light radiation of a sufficiently high intensity that it will remove by sublimation, evaporation, photodecomposition and spallation unwanted coating material covering the surface 17. The short wavelength ultraviolet light radiated from the head 14 of the system 9 as illustrated by wavy lines, penetrates the surface 17 to be treated, only to a very shallow depth, generally in the range of 0.1 $\mu$m or less. Accordingly, the radiated ultraviolet light will separate surface coatings (not shown) from its underlying substrates, without substantially affecting the underlying surface 17.

Considering now the process of treating the surface 17, to remove a coating of material therefrom, a user (not shown) drives the mobile unit 11 to a location near the surface 17. The user then manually or by means (not shown) positions the liquid-jet plasma pinch head 14 adjacent to the surface 17 to be stripped and activates the plasma control system 13. When the plasma control system 13 is activated the liquid jet plasma pinch head 14 emits pulsed high intensity incoherent ultraviolet light which the user directs and guides along the surface of the object to be treated.

As the ultraviolet light bathes the surface 17 of the object, the surface is rapidly heated to cause the coating material to be separated from its substrate, and otherwise removed or discharged therefrom.

Once the system 12 has been transported to the surface to be treated by the mobile unit 11, a user of the system 9 can move the liquid-jet plasma pitch light emitting head 14 manually or by means (not shown) relative to the surface 17 to be treated. It should be understood that the surface 17 may form a part of a larger structure, such as an aircraft, building or any other such large object requiring surface treatment. In this manner, the entire surface area of an item, such as an aircraft (not shown), may be treated with the high intensity incoherent ultraviolet light radiated by the liquid-jet plasma pinch system 9 For a more complete description of the physical principles as to how the liquid jet plasma pitch system generates high intensity ultraviolet light, reference may be made to the copending patent U.S. patent application Ser. No. 07/129,152 incorporated herein by reference.

Considering now the liquid-jet plasma pinch system 9 in greater detail with reference to FIGS. 1-4, the plasma control assembly or unit 13 is used with the plasma source liquid-jet pinch device or apparatus 14 to establish a central narrow liquid channel which is generally illustrated in broken lines at 16 (FIG. 2), for supplying mass for a plasma to be formed and pinched thereamong as more completely described in greater detail in the foregoing copending parent patent applications. The unit 13 includes a housing H, which has an inner elongated housing 18A having an evacuated sealed chamber 18, in which the liquid jet plasma pinch is established to produce the ultraviolet light. The liquid channel 16 extends axially within the chamber 18, and is initially in the form of a stream of liquid which flows under pressure through the chamber 18. A liquid vapor cloud 23 surrounds the liquid stream as it passes through the interior of the chamber 18, and cooperates therewith to form the main preionizing driver of the plasma system 12.

The plasma control assembly 13 includes a pump 19 (FIG. 4) for maintaining the flow of liquid via the cable 15 through the chamber 18. As shown in FIG. 4, the plasma control assembly 13 also includes a vacuum pump 20, which is connected in fluid communication via a suction or vacuum line 31 extends between the unit 13 and the head 14 via the cable 15, and for maintains the chamber 18 evacuated. As best seen in FIG. 4, the plasma control system 13 also includes a liquid storage tank 21 which provides a source of liquid or fluid for the liquid-jet pinch head 14. A machine control computer 95 controls the operation of the plasma control system 13 and establishes the pulsing rate for an electrical discharge system 25 to cause the vapor cloud 23 to be ionized for producing the incoherent ultraviolet light emitted from liquid jet plasma head 14 as it traverses adjacent to the surface 17 to be treated. The discharge system 25 generates vapor ionizing high voltage pulses at a desired frequency, such as a frequency of between substantially one per second and substantially 1000 times per second, depending on the desired effect of the treatment. A more preferred range is between about 1 pulse per second and about 1000 pulses per second. The most preferred repetition rate is about 10 pulses per second.

Considering now the head 14 in greater detail with reference to FIG. 2, a pair of axially spaced apart omitter and collector electrode assemblies 35 and 36 disposed at the opposite ends of the chamber 18 facilitate the establishment and maintenance of the liquid stream therebetween a pair of electrical conductors 51 and 51A extend through the cable 15, and are connected electrically between the discharge system 25 and the electrical assemblies 35 and 36, respectively, for establishing an electrical current flow through the preconditioning vapor cloud 23 of liquid along channel 16 to establish the plasma. The electrode assemblies 35 and 36 contain a liquid emitter 35A and a liquid receptor 36A respectively for directing the stream of liquid axially through the chamber 18.

The discharge system 25 delivers the high voltage pulses across the assemblies 35 and 36, at a potential of approximately 30,000 volts, to cause an electrical current to flow initially through the vapor cloud 23 for plasma producing ionization purposes. The stream of liquid absorbs the energy emanating from the non-dense plasma or ionized vapor cloud 23, and is, in turn, heated thereby. The liquid stream then becomes ionized, and is transformed into a high-Z dense plasma pinch to provide the high intensity ultraviolet light.

The generated plasma then conducts the continuing discharge electrical current, and produces high-intensity ultraviolet light. The generated dense pinched plasma diverts most of the discharge electrical current from the surrounding non-dense plasma, and conducts it along the channel 16 through the chamber 18. The resulting plasma is substantially stable, and is substantially uniform in cross section throughout its length.

Considering now the liquid jet chamber housing 18 in greater detail, it is generally an elongated vacuum chamber, which is polygonal in cross section throughout its axial length. In this regard, it is preferably generally hexagonal in cross section shape. A set of five reflective mirrors, such as a mirror 22, helps reflect or guide the incoherent ultraviolet light emitted from the high density plasma pinch through a transparent chamber window wall 24 forming a sixth wall through which the ultraviolet light is emitted toward the surface 17. The window wall 24 fits in, and is sealed over, by sealing means (no shown, an opening (not shown) in the wall "X" of the housing H. The transparent wall 24 is composed of material such as quartz, which is transparent to ultraviolet light.

The liquid jet head 14 includes a housing extension 26 having a pair of connectors 27 and 28 that permit fluid communication between the liquid storage system 21 and the electrode assemblies 35 and 36 inside the chamber 18. Connector 27 is an inlet connector for permitting liquid to flow under pressure via a conduit or tube 47 into the chamber 18, while connector 28 is an outlet connector for permitting liquid to flow from the chamber 18 back via a conduit or tube 36A into the liquid storage tank 29 located in mobile unit 11, the tubes 47 and 36A extending through the cable 15.

Considering now the unit 13 in greater detail with reference to FIG. 4, the unit 13 includes a small extension housing 46 which is substantially similar to the corresponding extension housing 26, and which connects the end of the cable 15 to the unit 13. A control valve 37 disposed within the housing 60 controls the flow of liquid into the liquid storage tank 29.

As best seen in FIG. 4, housing 60 confines the liquid storage tank 19, the vacuum pump 20, the discharge system 25, the machine control computer 95, and a portable power system (not shown) for supplying electrical power to the plasma control unit 13. It should be understood that the base housing unit 60 may include a set of rollers (not shown) so that it may be easily loaded onto and off of the mobile unit 11. In this manner, the entire system 9 can be transported by the mobile unit 11 to a remote location, and if desired, off loaded and moved to a locale not otherwise accessible to the mobile unit 11.

Figure 5:
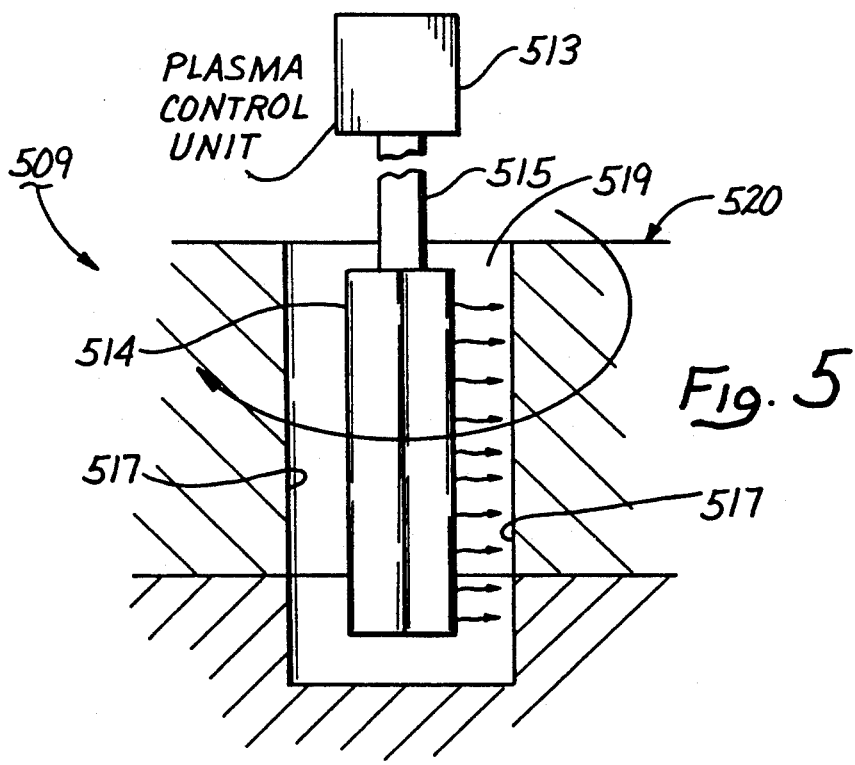
FIG. 5 is a diagrammatic, elevational view, partially in section, of another material processing system, which is constructed according to the present invention, and which is illustrated treating the interior surfaces of an aperture or hole.

Referring now to FIG. 5, there is illustrated an ultraviolet light surface treating system 509, which is also constructed in accordance with the present invention, and which is adapted for use in an inventive parts manufacturing process for treating the surface of a workpiece or object in the form of an engine block 520 having a cylinder bore 519 to be glazed. The illustrated and described system 509 is able to perform a variety of surface treating processes, such as biological decontamination, chemical decontamination, ceramic glazing, metal glazing, plastic film removal, metal film removal, and the like. It should therefore be understood that, although only a glazing process will hereinafter be described, the other mentioned processes, are performed in a similar substantially the same manner, with only the exposure time being varied to accomplish the intended purpose.

The surface treating system 509 is similar to the liquid-jet plasma pinch system 9, except that the system 509 is adapted to treat inside surfaces, even on small parts. In this regard, the system 509 includes a plasma source system 513 having a plasma pinch head 514, which emits a highly intense ultraviolet light, and which is adapted to be lowered into an opening, such as the bore 519.

The ultraviolet light emitted from the plasma pinch head 514 is directed toward the interior surface of an object, such as the engine block cylinder 520. The engine block 520 and the head 514 are manually rotated relative to one another, by motive means (not shown) about the axis of the bore 519 so the entire interior wall surface of the cylinder bore 519 is exposed to the ultraviolet light emitted from the head 514, for glazing purposes. The plasma control unit 513, which is substantially identical to the plasma control assembly 13 of FIG. 1 flexible cable 515 which is similar to the cable 15 of FIG. 1, couples the plasma pinch head 514 to the control unit 513.

Considering now the process of treating an interior surface, such as the surface 517 of the bore 519, for glazing purposes, a conveyor system (not shown) positions the engine block 520 in the general proximity of the plasma pinch head 514. The plasma pinch head 514 is then manually positioned by means (not shown), entirely within the bore 519 adjacent to the surface 517 to be glazed. When the head 514 has been so positioned, the plasma control assembly 513 is activated to cause the head 514 to emit high intensity incoherent ultraviolet light, which is directed radially against a portion of the cylindrical wall surface 517 to be glazed. The block 520 is then rotated manually or by means (not shown) about the axis of the device 514. Alternatively, the head can be rotated, and the block remains stationary.

As the block 520 and the head 514 are rotated about the axis of the head 514 relative to one another, the interior wall surface 517 of the block 520 is rapidly heated to cause the surface to be glazed.

Figure 6:
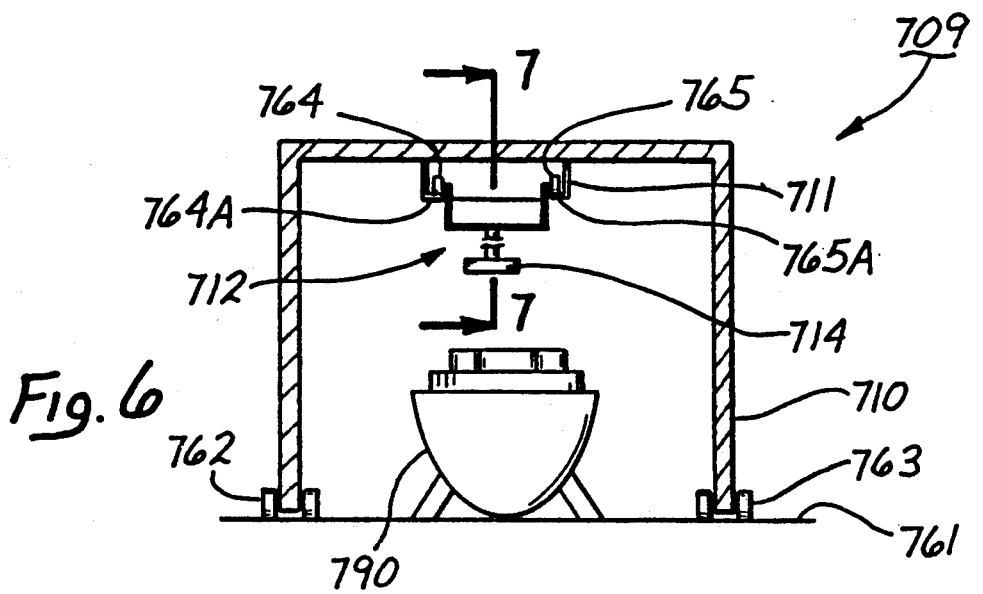
FIG. 6 is a diagrammatic view of an overhead mounted material processing system, which is also constructed in accordance with the present invention, and which is illustrated in the process of treating a vehicle.
Figure 7:
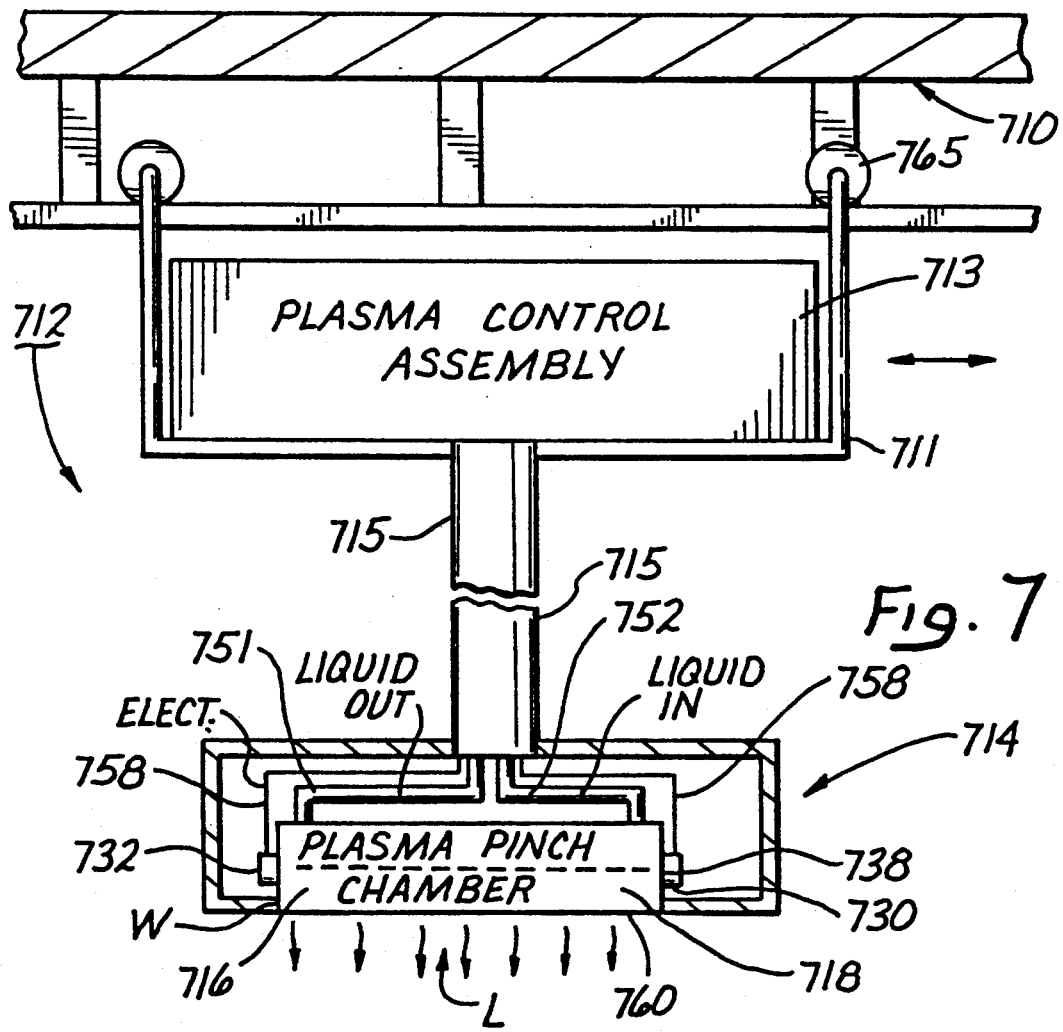
FIG. 7 is an enlarged, fragmentary partially diagrammatic sectional view of the material processing system of FIG. 6 taken substantially on line 7—7 thereof.

Referring now to FIGS. 6 and 7, there is illustrated a plasma pinch treating arrangement 709, having a liquid jet plasma pinch system 712, which is also constructed in accordance with the present invention, and which is adapted for use with a movable crane 710 to treat the exterior surface of a large stationary object, such as a ship 790. In this regard, the crane 710, is rollably supported on the ground 761 by wheels 762 and 763, and is able to transport the plasma pinch system 712 along the longitudinal axis of the ship 790 so that the entire exterior surface areas side of along either its longitudinal axis may be treated.

The crane 710 supports from above a movable platform 711 for carrying the system 712 rollably on wheels such as wheels 764 and 765 aloud overhead tracks 764A and 765A of the crane 710, and for permitting the system 712 to be moved along the horizontal axis of the ship.

The liquid jet plasma pinch system 712 is similar to the system 10 of FIG. 1 and establishes a source of high intensity incoherent ultraviolet light radiation of sufficient intensity to remove unwanted or undesired coating materials covering a surface of an object, such as the ship 790. The high intensity, pulsed ultraviolet light radiated by the system 712 as indicated illustrated by wavy lines generally designated at L, penetrate the surface of the object to be treated to a very shallow depth only. Accordingly, the radiated ultraviolet light removes surface coating without substantially affecting the object to which the coating is affixed.

The plasma pinch system 712 includes a plasma control assembly 713 which is mounted on the movable platform 711, and which is similar to the plasma control assembly of FIG. 1. The platform 711 is movable manually or by motive means (not shown). The system 712 also includes a liquid jet plasma pinch assembly or head 714 which is connected to the plasma control assembly 713 by a flexible cable 715, and which is similar to the head 14 of FIG. 1. The head 714 is also movable manually or by motive means (not shown) relative to the surface to be treated. In this manner, the entire surface area of a large object such as the ship 790, may be accomplished simply and conveniently. For a more complete explanation of the liquid jet plasma pinch system 712, reference can be made to U.S. Pat. No. 4,450,568 and the other foregoing mentioned patent application which are incorporated herein by reference.

Once the system 712 has been positioned relative to the object to be treated, a user of the system may move the plasma pinch head 714 along the surface area of the object, to dislodge the unwanted and undesired coating materials.

Considering now the plasma pinch head 714 in greater detail with reference to FIG. 7, the head 714 generates a pulsed high intensity incoherent ultraviolet light, used to a coating from the surface of an object, such as the ship 790. The plasma is initiated within a liquid jet plasma pinch vacuum chamber assembly 718, which is similar to the chamber 18 of FIG. 1. As shown in FIG. 7, a liquid jet is directed along the chamber axis as indicated in broken lines at 716, so as to form a plasma pinch in the region along the liquid jet, in a manner as previously for the head 14 of FIG. 2.

Considering now the plasma control assembly 713 in greater detail depending flexible with reference to FIG. 7, the plasma control assembly 713 is connected via the depending flexible cable 715 to the head 714, and is similar to the control assembly 60 of FIG. 4. For a more detailed description of this arrangement, reference may be made to the foregoing co-pending patent application.

A pair of liquid conduits 751 and 752 conveying the plasma forming liquid under pressure into and out of the chamber 718.

The discharge system (not shown) in the assembly 713 is connected via electrically leads 738 and 758 for generating high voltage electrical pulses to establish a plasma pinch along the liquid stream 716 thereamong. A pair of electrodes 730 and 732 are connected to the respective lines 758 and 758 for delivering plasma ionizing current along the liquid stream 716 between the electrodes 730 and 732. Thus, ultraviolet radiation L is emitted substantially uniformly over the duration of the pinch and is radiated through a window W.

Figure 8:
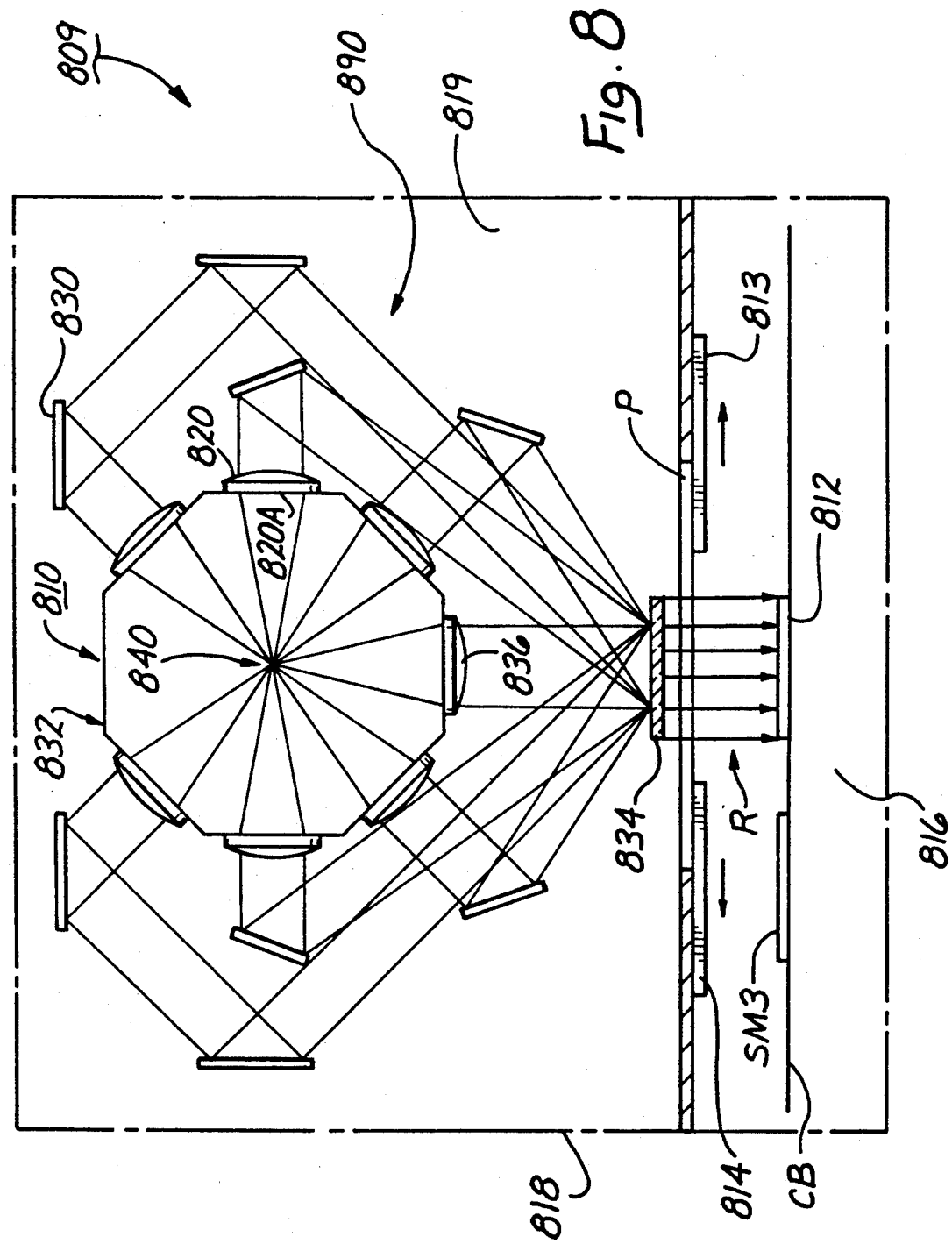
FIG. 8 is a diagrammatic view of yet another material processing system which is also constructed according to the present invention, and which guides radiated ultraviolet light within a processing chamber.

Referring now to FIG. 8, there is illustrated a semiconductor processing system 809, which is also constructed in accordance with the present invention; and which is adapted for use in a inventive step of a semiconductor manufacturing process. The step of the process could be at an anneal, etching, super cleaning, or the like surface treatment of semiconductor materials, such as the semiconductor materials SM3, or 812 on a conveyor belt CB. The illustrated and described system 809 is a surface treating system, which is similar to the liquid jet plasma pinch surface treating system 9 described herein. While the system 809 is able to perform a variety of surface treating processes, such as super-cleaning semiconductor materials, annealing or etching of various components, chemical synthesis, and the like, a super-cleaning process will be described hereinafter in greater detail. However, it should be understood that the other mentioned processes are performed on substantially the same manner, with the only exposure time of the surface being varied to accomplish the intended process.

As the illustrated and described system 809 is substantially similar to the liquid-jet plasma-pinch surface treating system 9 previously described, only those aspects of the system which are of significant difference will be described hereinafter in greater detail. It should be understood however, that the system 809 emits a highly intense pulsed ultraviolet light, which is directed toward the surface of an object, such as object 812 via an optical system generally indicated at 890. The optical system 890 permits a large amount of the incoherent radiated ultraviolet light to bathe the object 812 with a pulse highly intense ultraviolet light in an efficient manner, because of the light collecting and directing capabilities provided by the optical system 809.

Considering now the system 809 in greater detail with reference to FIG. 8, the system 809 utilizes a liquid-jet plasma-pinch system generally indicated at 810 for establishing a source of high intensity ultraviolet radiation indicated by the solid parallel lines indicated at R.

The pinched plasma generates an ultraviolet light of sufficient intensity to super-clean the semiconductor material, such as material 812 or the material SM3, as they are being transported adjacent the optical lens system 890. As indicated diagrammatically in FIG. 8, the optical system 890 permits the radiated ultraviolet light to be reflected over the entire surface of the material.

The liquid-jet plasma-pinch system 810 includes an enclosed processing chamber indicated at 818 for confining the liquid-jet plasma pinch 810 and the optical system 890. The processing chamber is in atmospheric communication with a source of inert gas, such as helium, which back-fills the chamber 818. The purpose of the inert gas is to help facilitate the passage of the emitted ultraviolet light in a generally unimpeded manner, known to those skilled in the art, that air or other non-inert gases react with and absorb the ultraviolet light thereby diminishing its life duration.

As best seen in FIG. 8, the system 810 also includes a housing 818 defining a chamber with an outlet window or port, over which a pair of exposure doors 813 are movably manually, or by motive means (not shown) to be moved between a normally closed position over: port P, and a fully opened position to expose the object or workpiece to the intense ultraviolet light emitted from the pinch system 810. Exposure doors 813 and 814 block the ultraviolet light emitted from the plasma pinch 840 from being exposed to a working area 816, until the next object, such as the semiconductor material SM3, is moved by the conveyor belt 3B to the area 816 opposite the port.

The liquid-jet plasma-pinch system 810 includes a plasma control assembly (not shown), which is substantially similar to plasma control assembly 13, and thus, will not be described hereinafter in greater detail.

Considering now the doors 813 and 814, they are slidable mounted in a common vertical plane, and move toward and away from one another. When closed, they engage one another in a side-by-side configuration. When fully opened, they are spaced apart fully out of alignment with the port P.

Considering now the optical system 890 in greater detail with reference to FIG. 8, the optical system 890 generally includes a plurality of lenses, such as a spherical quartz lens 820, which individually fit within windows, such as a window 820A for the lens 820, of a plasma chamber shown diagrammatically at 832, within the larger chamber 819. The optical system 890 further includes a plurality of mirrors, such as mirror 830 disposed within chamber 819, outside chamber 832. The lenses, focuses the high intensity incoherent ultraviolet light emitted radially from the plasma pinch, shown diagrammatically at 840 toward the mirrors, such as mirror 830 and from the mirrors forwardly to a common lens at the port P. As the ultraviolet light impinges upon the reflective surface of the mirrors, the mirrors are so arranged to reflect light either directly or indirectly forwardly through the common lens 834 within the chamber 819, toward a single object surface such as the surface of the semiconductor material 812. In this manner, in order to utilize more efficiently and effectively the light generated by the pinch 840, a substantial portion of the high intensity incoherent ultraviolet light emitted from the plasma pinch 840 can be collected and directed toward the surface of the material to be treated.

The lenses are arranged surrounding the plasma pinch 840 to focus the incoherent light from the pinch 840 radially outwardly from the inner plasma chamber 832. For each one of the lenses, except the forward or front lens 836 focus directly at the common lens 834, there is a corresponding mirror which reflects the light passing through its lens either directly to the common lens 834, or to another one of the mirrors and then to the common law 834.

Considering now the super or ultra cleaning process in greater detail with reference to FIG. 8, for the purpose of super-cleaning the surface of a semiconductor wafer, such as semiconductor material SM3, the conveyor belt CB moves the material SM3 into the working area or exposure chamber 816 of the housing 818. When the material SM3 is so positioned relative to the port P, the exposure doors 813 and 814 are moved manually or by motive means to their fully opened position, thereby permitting the material to be exposed to the ultraviolet light being focused within the working area 816 by the optical system 890. As the material is bathed in the ultraviolet light via the optical system, a temperature sensing or optical scattering device (not shown) monitors the condition of the semiconductor material 812 so that the surface temperature will not be raised to an excess temperature that might either damage or modify the conductivity properties of the semiconductor material SM3.

When the material has been raised to a sufficient temperature for super cleaning the surface thereof, the exposure door 813 is moved to a closed position to retain the helium therewithin, and the semiconductor material SM3 is carried via the conveyor belt CB out of the chamber. This process is repeated for each workpiece or material to be processed. It should be understood by the working area 816 being disposed within the chamber 818, working area 816 is also back filled with the inert helium gas to assure that a substantial portion of ultraviolet light generated by the plasma pinch 840 is able to be utilized in process the semiconductor material SM3. As an alternative technique, the door can remain opened for a predetermined time interval so that the workpiece or object is exposed to the ultraviolet light for a predetermined time interval.

The liquid-jet plasma-pinch system 810 may be mounted in a mobile unit (not shown) or in a fixed processing location, such as a processing center (not shown). In this regard, the system 809 may be transported to a remote location to process a single work piece object or conversely, the system 809 may be set up in a manufacturing facility to process a multiple number of work piece object on an assembly line basis.

While particular embodiments of the present invention have been disclosed, it is to be understood that various different modifications are possible and are contemplated within the true spirit and scope of the appended claims. For example, there are a variety of different types and kinds of applications for the system and method of the present invention. In this regard, references may be made to the following table:

APPLICATIONS

SEMICONDUCTOR ANNEALING

METAL GLAZING (met-glass anti-wear, anti-corrosion surface)

CHEMICAL DECONTAMINATION OF SURFACES

BIOLOGICAL DECONTAMINATION OF SURFACES

AIRCRAFT PAINT STRIPPING (composites and honeycombs)

ULTRA-CLEAN SURFACES (electronics and optics fabrication)

CLEAN SURFACES (coated metals production)

CORROSION REMOVAL (ferrous and non-ferrous metals)

CERAMIC GLAZING

MATERIALS TESTING (ultrasonic coupling)

CHEMICAL SYNTHESIS (photochemical catalysis)

PLASTIC FILM REMOVAL (plastics plant maintenance)

GRAFFITI REMOVAL (buildings and subway cars)

VARNISH REMOVAL (art restoration)

MARKING (electronic components)

PRINTING RUN CORRECTIONS (ink eraser)

There is no intention, therefore, of limitations to the exact abstract or disclosure herein presented.

What is claimed is:

1. An apparatus for treating a surface comprising:
a pair of spaced apart combination liquid emitter and electrode means, and combination liquid receptor and electrode means;
means for flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid;
discharge means for establishing an electrical voltage potential difference between said electrode means of a sufficient high voltage to cause electrical current to flow through said liquid vapor cloud for establishing initially a low density plasma thereamong sufficient to emanate energy therefrom to said flowing liquid stream to heat it sufficiently to cause it to become ionized and to be converted into a high density plasma in response to said low density plasma;
a plasma pinch assembly for containing said high density plasma, said plasma pinch assembly including vacuum chamber means for confining said plasma wherein said combination liquid emitter, and electrode means and combination liquid receptor and electrode means are mounted within said vacuum chamber means;

a plasma control assembly for supplying the electrical voltage and the liquid to said plasma pinch assembly;
a flexible cable for coupling said plasma control assembly to said plasma pinch assembly;
means for mounting movably said plasma pinch assembly relative to said plasma control assembly; and
means for mounting movably said plasma control assembly relative to the surface to be treated.

2. An apparatus according to claim 1 wherein said combination liquid emitter and electrode and combination liquid receptor and electrode means each comprise:
an inner tube composed of electrically conductive material to permit electric current to flow therethrough;
means connected in fluid communication with said inner tube for permitting liquid communication between the inner tube and the stream of liquid; and
an outer tubular element having nozzle means connected in fluid communication with said tube.

3. A system for treating a surface comprising:
liquid-jet pinch means for establishing a source of incoherent ultraviolet light of sufficient intensity to treat the surface;
said liquid-jet pinch means including a pair of spaced apart combination liquid emitter and electrode means, and combination liquid receptor and electrode means, means for flowing between said pair of electrode means a fine stream of liquid under sufficient pressure in a substantially narrow, straight and focused configuration, to cause the formation thereabout of a tenuous liquid vapor preconditioning cloud surrounding the flow fine stream of liquid under pressure, and means for establishing an electrical voltage potential difference between said electrode means of a sufficiently high voltage to cause electrical current to flow through said liquid vapor cloud for establishing initially a low density plasma therealong sufficient to emanate energy therefrom to said flowing liquid stream to heat it sufficiently to cause it to become ionized and to be converted into a high density plasma in response to said low density plasma to generate high intensity incoherent ultraviolet light;
optical means for guiding the ultraviolet light generated by said liquid-jet pinch means toward the surface to be treated; and
means for exposing the surface to said incoherent ultraviolet light.

4. A system according to claim 3, wherein said means for flowing includes:
gas-chamber means for confining a plasma source;
means for directing said fine steam of fluid under pressure through the interior of the vacuum chamber to establish a plasma source composed of a tenuous vapor preconditioning cloud surrounding a central narrow flowing fine stream of fluid under pressure.

5. A system according to claim 4, wherein said optical system includes a plurality of elements disposed surrounding said stream to direct the light therefrom through an outlet port in said chamber.

6. A system according to claim 5, wherein said elements include lenses and reflective members.

7. A system for removing impurities from the surface of a semiconductor material, comprising:

means for establishing a high intensity incoherent ultraviolet light having a sufficient intensity to remove impurities from the surface of the semiconductor material without substantially varying the conductivity properties of the semiconductor material;

said means for establishing including a pair of spaced apart combination liquid emitter and electrode means, and combination liquid receptor and electrode means, means for flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid under pressure, and means for establishing an electrical voltage potential difference between said electrode means of a sufficient high voltage to cause electrical current to flow through said liquid vapor cloud for establishing initially a low density plasma therealong sufficient to emanate energy therefrom to said flowing liquid stream to heat it sufficiently to cause it to become ionized and to be converted into a high density plasma in response to said low density plasma to generate high intensity incoherent ultraviolet light;

means for directing said ultraviolet light toward the surface of the semiconductor material for heating the surface thereof; and means for pulsating said ultraviolet light repetitively at a high rate of speed to cause the impurities on the surface of the semiconductor material to be removed in response thereto.

8. A system for glazing the surface of an object, comprising:

a pair of spaced apart combination liquid emitter and electrode means, and combination liquid receptor and electrode means;

means for flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid under pressure;

means for establishing an electrical voltage potential difference between said electrode means of a sufficiently high voltage to cause electrical current to flow through said liquid vapor cloud for establishing initially a low density plasma therealong sufficient to emanate energy therefrom to said flowing liquid stream to heat is sufficiently to cause it to become ionized and to be converted into a high density plasma in response to said low density plasma to generate high intensity incoherent ultraviolet light; and means for exposing the surface of the object to said high intensity incoherent ultraviolet light.

9. A system according to claim 8, wherein said means for exposing the surface of the object includes means for transporting a series of similar objects relative to the plasma.

10. A system according to claim 8, further including:
gas-chamber means for confining said plasma source and said object; and
means for directing the fine stream of fluid under pressure through the interior of the chamber.

11. A system according to claim 10, further including an inert gas disposed within said chamber.

* * * * *